United States Patent
Lin et al.

(10) Patent No.: US 9,496,461 B2
(45) Date of Patent: Nov. 15, 2016

(54) LIGHT EMITTING DIODE PACKAGE STRUCTURE

(71) Applicant: Genesis Photonics Inc., Tainan (TW)

(72) Inventors: Yu-Feng Lin, Tainan (TW); Po-Tsun Kuo, Tainan (TW); Meng-Ting Tsai, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 14/686,790

(22) Filed: Apr. 15, 2015

(65) Prior Publication Data

US 2015/0325758 A1    Nov. 12, 2015

(30) Foreign Application Priority Data

May 7, 2014    (TW) .............................. 103116264 A

(51) Int. Cl.
*H01L 33/48*    (2010.01)
*H01L 33/50*    (2010.01)
*H01L 33/56*    (2010.01)
*H01L 33/54*    (2010.01)
*H01L 33/62*    (2010.01)

(52) U.S. Cl.
CPC ........... *H01L 33/486* (2013.01); *H01L 33/507* (2013.01); *H01L 33/56* (2013.01); *H01L 33/54* (2013.01); *H01L 33/62* (2013.01)

(58) Field of Classification Search
CPC ... H01L 33/486; H01L 33/56; H01L 33/507; H01L 33/62; H01L 33/54
See application file for complete search history.

(56) References Cited

U.S. PATENT DOCUMENTS 7,859,006 B2 *   12/2010   Kato ..................... C08G 77/04
                                                         257/100
8,835,192 B2 *    9/2014   Kojima .................. H01L 33/50
                                                         438/16

FOREIGN PATENT DOCUMENTS

| EP | 2487730 | 8/2012 |
| TW | 200825155 | 6/2008 |
| TW | 200927822 | 7/2009 |
| TW | M461876 | 9/2013 |

OTHER PUBLICATIONS

"Office Action of Taiwan Counterpart Application", issued on Jan. 15, 2016, p. 1-p. 6.

* cited by examiner

*Primary Examiner* — David Vu
(74) *Attorney, Agent, or Firm* — Jianq Chyun IP Office

(57) ABSTRACT

A LED package structure including a carrier substrate, a flip-chip LED and a molding compound is provided. The carrier substrate includes a main body and a patterned conductive layer embedded in the main body. The main body is composed of polymer material. The main body has a cavity, and a bottom surface of the cavity is aligned with an upper surface of the patterned conductive layer. A difference in coefficient of thermal expansion between the main body in a rubbery state and the patterned conductive layer is smaller than 30 ppm/° C. The flip-chip LED is disposed inside the cavity and electrically connected to the patterned conductive layer. The molding compound is disposed inside the cavity and encapsulates the flip-chip LED. A vertical distance between a top surface of the molding compound and the bottom surface of the cavity is smaller than or equal to a depth of the cavity.

10 Claims, 3 Drawing Sheets

LIGHT EMITTING DIODE PACKAGE STRUCTURE

CROSS-REFERENCE TO RELATED APPLICATION

This application claims the priority benefit of Taiwan application serial no. 103116264, filed on May 7, 2014. The entirety of the above-mentioned patent application is hereby incorporated by reference herein and made a part of this specification.

BACKGROUND OF THE INVENTION

Field of the Invention

The invention relates to a package structure, and particularly relates to a light emitting diode package structure.

Description of Related Art

In a conventional concave cup type light emitting diode (LED) package structure, a LED is generally disposed on a main body of a carrier substrate made of a ceramic material, where the LED is located in a cavity and is electrically connected to a pin electrode of the carrier substrate through wire bonding. However, a height of the bonding wire required by the wire bonding may directly influence a usage amount of a molding compound and an overall thickness of the LED package structure, so that the usage amount of the molding compound cannot be decreased, and the LED package structure cannot satisfy today's thinning demand.

SUMMARY OF THE INVENTION

The invention is directed to a light emitting diode (LED) package structure, which has a thinner package thickness to cope with today's thinning demand.

The invention provides a light emitting diode (LED) package structure including a carrier substrate, a flip-chip LED and a molding compound. The carrier substrate includes a main body and a patterned conductive layer embedded in the main body. The main body is composed of a polymer material. The main body has a cavity, and a bottom surface of the cavity is aligned with an upper surface of the patterned conductive layer. A difference in coefficient of thermal expansion (CTE) between the main body in a rubbery state and the patterned conductive layer is smaller than 30 ppm/° C. The flip-chip LED is disposed inside the cavity of the carrier substrate and straddles the patterned conductive layer. The molding compound is disposed inside the cavity of the carrier substrate and encapsulates the flip-chip LED. A vertical distance between a top surface of the molding compound and the bottom surface of the cavity is smaller than or equal to a depth of the cavity.

In an embodiment of the invention, the flip-chip LED and the patterned conductive layer are electrically connected through eutectic bonding.

In an embodiment of the invention, the polymer material includes epoxy resin or a siloxane compound.

In an embodiment of the invention, a difference in coefficient of thermal expansion (CTE) between the main body in the rubbery state and the main body in a glassy state is smaller than 35 ppm/° C.

In an embodiment of the invention, a sidewall of the cavity surrounds the bottom surface, and the bottom surface and the sidewall include an included angle, where the included angle ranges between 95 degrees and 170 degrees.

In an embodiment of the invention, a center point of the bottom surface and an edge of the bottom surface of the cavity are spaced by a straight-line distance, and the straight-line distance is greater than or equal to 1 cm and is smaller than or equal to 2 cm.

In an embodiment of the invention, the top surface of the molding compound and the upper surface of the patterned conductive layer are spaced by a vertical height, and a ratio between the vertical height and the straight-line distance is between 0.15 and 0.25.

In an embodiment of the invention, the top surface of the molding compound and an upper surface of the flip-chip LED are spaced by a vertical distance, and the vertical distance ranges between 0.05 cm and 0.3 cm.

In an embodiment of the invention, the molding compound is doped with a fluorescent material, and the fluorescent material includes a yellow fluorescent powder, a red fluorescent powder, a green fluorescent powder, a blue fluorescent powder or a yttrium aluminum garnet fluorescent powder, and a particle diameter of the fluorescent powder ranges between 3 μm and 50 μm.

In an embodiment of the invention, a weight percentage concentration of the fluorescent material in the molding compound ranges between 20% and 40%.

According to the above descriptions, since the flip-chip LED of the invention is disposed in the cavity of the carrier substrate, and the vertical distance between the top surface of the molding compound and the bottom surface of the cavity is smaller than or equal to the depth of the cavity, compared to the conventional technique that the LED is electrically connected to the pin electrode through wire bonding, the LED package structure of the invention may have a thinner package thickness, so as to cope with today's thinning demand. Moreover, since the main body of the carrier substrate of the invention is composed of a polymer material, and the difference in CTE between the main body in the rubbery state and the patterned conductive layer is smaller than 30 ppm/° C., a situation that the main body and the patterned conductive layer are peeled off when the temperature drops to result in a fact that the flip-chip LED cannot be effectively fixed on the patterned conductive layer is avoided. In brief, the LED package structure of the invention has better structural reliability.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
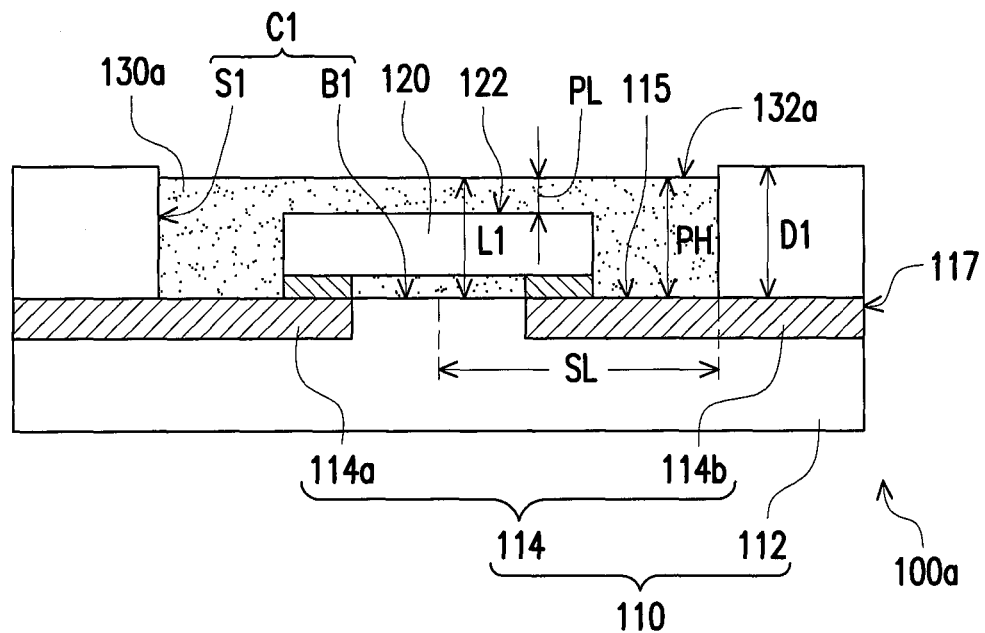
FIG. 1A is a cross-sectional view of a light emitting diode (LED) package structure according to an embodiment of the invention.
Figure 1B:
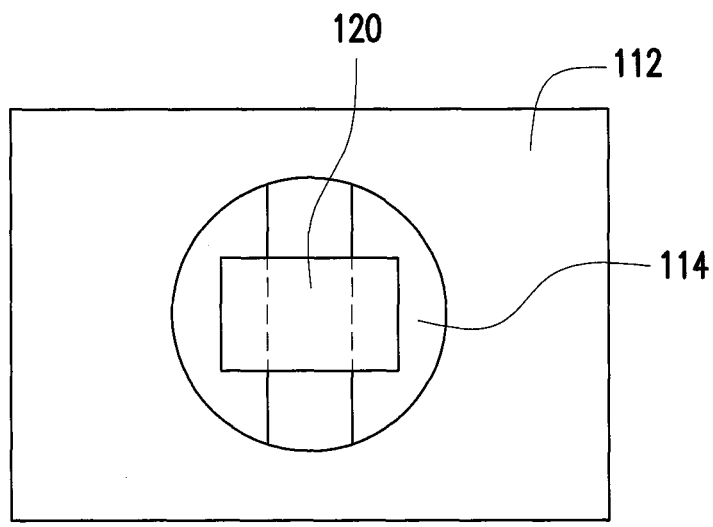
FIG. 1B is a top view of the LED package structure of FIG. 1A.

FIG. 1A is a cross-sectional view of a light emitting diode (LED) package structure according to an embodiment of the invention. FIG. 1B is a top view of the LED package structure of FIG. 1A. Referring to FIG. 1A, in the present embodiment, the LED package structure 100a includes a carrier substrate 110, a flip-chip LED 120 and a molding compound 130a. The carrier substrate 110 includes a main body 112 and a patterned conductive layer 114 embedded in the main body 112. The main body 112 is composed of a polymer material. The main body 112 has a cavity C1, and a bottom surface B1 of the cavity C1 is aligned with an upper surface 115 of the patterned conductive layer 114. A difference in coefficient of thermal expansion (CTE) between the main body 112 in a rubbery state and the patterned conductive layer 114 is smaller than 30 ppm/° C. The flip-chip LED 120 is disposed inside the cavity C1 of the carrier substrate 110 and straddles the patterned conductive layer 114. The molding compound 130a is disposed inside the cavity C1 of the carrier substrate 110 and encapsulates the flip-chip LED 120. A vertical distance L1 between a top surface 132a of the molding compound 130a and the bottom surface B1 of the cavity C1 is smaller than a depth D1 of the cavity C1.

In detail, in the present embodiment, the carrier substrate 110 is formed through a transfer molding method, in which the patterned conductive layer 114 is wrapped by the main body 112 and only the upper surface 115 and a side surface 117 thereof are exposed. As shown in FIG. 1A, the side surface 117 of the patterned conductive layer 114 of the present embodiment is substantially aligned with a peripheral surface of the main body 112. The main body 112 is composed of the polymer material, where the polymer material includes epoxy resin or a siloxane compound, and a material of the patterned conductive layer 114 is, for example, a metal material or a conductive material, and the patterned conductive layer 114 can be regarded as a pin electrode, and the patterned conductive layer 114 may include a first conductive portion 114a and a second conductive portion 114b, where the first conductive portion 114a and the second conductive portion 114b are isolated by the main body 112. The flip-chip LED 120 straddles the patterned conductive layer 114. In other words, two pin electrodes of the flip-chip LED 120 are respectively disposed on the first conductive portion 114a and the second conductive portion 114b, and the flip-chip LED 120 and the patterned conductive layer 114 are electrically connected through eutectic bonding, so that the flip-chip LED 120 can be effectively fixed on the carrier substrate 110 to achieve better stableness.

Moreover, main body 112 of the carrier substrate 110 of the present embodiment is composed of the polymer material, and the difference in CTE between the main body 112 in the rubbery state and the patterned conductive layer 114 is smaller than 30 ppm/° C. Preferably, a difference in CTE between the main body 112 in the rubbery state and the main body 112a in a glassy state is smaller than 35 ppm/° C. Therefore, during the eutectic bonding, based on a material characteristic of the main body 112, the main body 112 is not liable to have a large deformation due to the heat, and when the temperature drops, since the CTEs between the main body 112 and the patterned conductive layer 114 are matched to each other, a situation that the main body 112 and the patterned conductive layer 114 are peeled off due to the thermal expansion and contraction to result in a fact that the flip-chip LED 120 cannot be effectively fixed on the patterned conductive layer 114 is avoided. In other words, the LED package structure 100a of the present embodiment has better structural reliability.

As shown in FIG. 1A and FIG. 1B, a sidewall S1 of the cavity C1 vertically surrounds the bottom surface B1, though the invention is not limited thereto. A center point of the bottom surface B1 and an edge of the bottom surface B1 of the cavity C1 are spaced by a straight-line distance SL, and the straight-line distance SL is greater than or equal to 1 cm and is smaller than or equal to 2 cm. A top view shape of the bottom surface B1 is not limited by the invention, and as long as the straight-line distance SL is complied with the aforementioned range, it is considered to be within the protection scope of the invention. Moreover, the top surface 132a of the molding compound 130a and the upper surface 115 of the patterned conductive layer 114 are spaced by a vertical height PH, and a ratio between the vertical height PH and the straight-line distance SL is between 0.15 and 0.25. Since the bottom surface B1 of the cavity C1 is aligned with the upper surface 115 of the patterned conductive layer 114, the vertical height PH is substantially equal to the vertical distance L1. Moreover, the top surface 132a of the molding compound 130a and an upper surface 122 of the flip-chip LED 120 are spaced by a vertical distance PL, and the vertical distance PL ranges between 0.05 cm and 0.3 cm. Namely, a thickness of the molding compound 130a is only slightly greater than the height of the flip-chip LED 120, such that a usage amount of the molding compound 130a is effectively decreased.

Since the flip-chip LED 120 of the present embodiment is disposed inside the cavity C1 of the carrier substrate 110, the thickness of the molding compound 130 is only slightly greater than the height of the flip-chip LED 120, and the cavity C1 has a shallow tray design (the ratio between the vertical height PH and the straight-line distance SL is between 0.15 and 0.25), compared to the conventional technique that the LED is electrically connected to the pin electrode through wire bonding, the LED package structure 100a of the present embodiment has a thinner package thickness, which is complied with today's thinning demand. Moreover, since the main body 112 of the carrier substrate 110 of the present embodiment is composed of the polymer material, and the difference in CTE between the main body 112 in the rubbery state and the patterned conductive layer 114 is smaller than 30 ppm/° C., a situation that the main body 112 and the patterned conductive layer 114 are peeled off when the temperature drops to result in a fact that the flip-chip LED 120 cannot be effectively fixed on the patterned conductive layer 114 is avoided. In brief, the LED package structure 100a of the present embodiment has better structural reliability.

It should be noticed that reference numbers of the components and a part of contents of the aforementioned embodiment are also used in the following embodiment, where the same reference numbers denote the same or like components, and descriptions of the same technical contents are omitted. The aforementioned embodiment can be referred for descriptions of the omitted parts, and detailed descriptions thereof are not repeated in the following embodiment.

Figure 2:
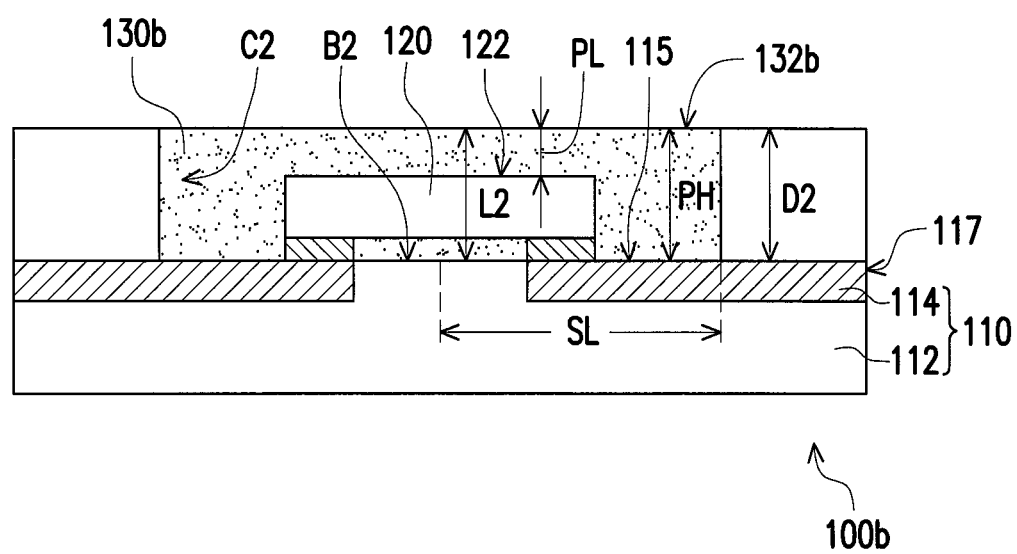
FIG. 2 is a cross-sectional view of a LED package structure according to another embodiment of the invention.

FIG. 2 is a cross-sectional view of a LED package structure according to another embodiment of the invention. Referring to FIG. 2, the LED package structure 100b of the present embodiment is similar to the LED package structure 100a of FIG. 1A, and a main difference there between is that a vertical distance L2 between the top surface 132b of the molding compound 130b and the bottom surface B2 of the cavity C2 is equal to the depth D2 of the cavity C2. Namely, the thickness of the molding compound 130b of the LED package structure 100b of the present embodiment is substantially equal to the depth D2 of the cavity C2, and is also equal to the vertical distance L2.

Figure 3:
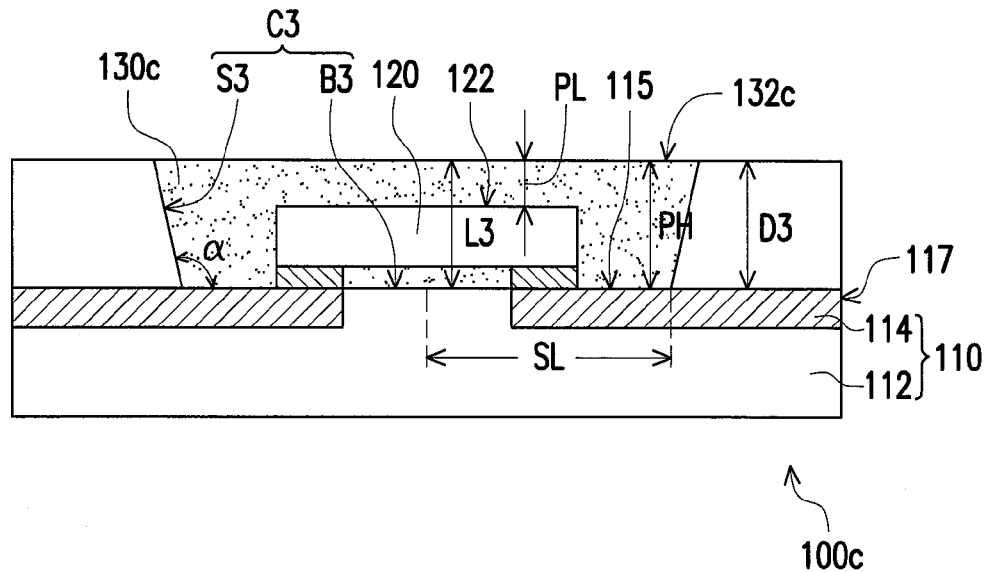
FIG. 3 is a cross-sectional view of a LED package structure according to still another embodiment of the invention.

FIG. 3 is a cross-sectional view of a LED package structure according to still another embodiment of the invention. Referring to FIG. 3, the LED package structure 100c of the present embodiment is similar to the LED package structure 100a of FIG. 1A, and a main difference there between is that the sidewall S3 of the cavity C3 surrounds the bottom surface B3, and the bottom surface B3 and the sidewall S3 include an included angle α, and the included angle α ranges between 95 degrees and 170 degrees. Moreover, the vertical distance L3 between the top surface 132c of the molding compound 130c of the present embodiment and the bottom surface B3 of the cavity C3 is equal to the depth D3 of the cavity C3. Namely, the thickness of the molding compound 130c of the LED package structure 100c of the present embodiment is substantially equal to the depth D3 of the cavity C3, and is also equal to the vertical distance L3.

Since the included angle α between the bottom surface B3 and the sidewall S3 of the cavity C3 ranges between 95 degrees and 170 degrees, a lateral light emitted by the flip-chip LED 120 can be effectively reflected, so as to improve a forward light emitting efficiency and a light emitting area of the LED package structure 100c.

Figure 4:
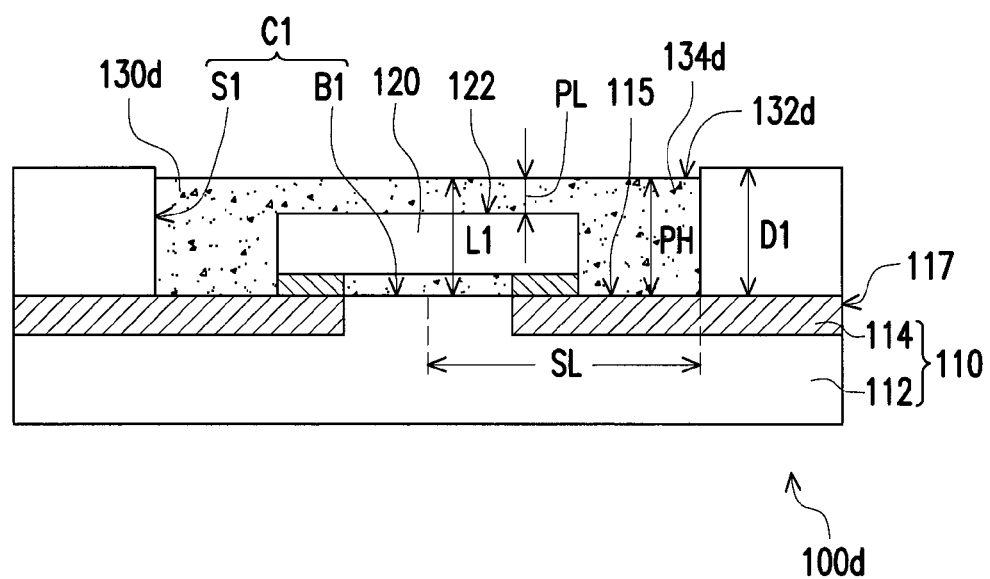
FIG. 4 is a cross-sectional view of a LED package structure according to yet another embodiment of the invention.

FIG. 4 is a cross-sectional view of a LED package structure according to yet another embodiment of the invention. Referring to FIG. 4, the LED package structure 100d of the present embodiment is similar to the LED package structure 100a of FIG. 1A, and a main difference there between is that in order to change a color of the light provided by the LED package structure 100d, the molding compound 130d is doped with a fluorescent material 134d, where the fluorescent material 134d includes a yellow fluorescent powder, a red fluorescent powder, a green fluorescent powder, a blue fluorescent powder or a yttrium aluminum garnet fluorescent powder, and a particle diameter of the fluorescent powder 134d ranges between 3 μm and 50 μm. A weight percentage concentration of the fluorescent material 134d in the molding compound 130d ranges between 20% and 40%.

In the present embodiment, since the flip-chip LED 120 and the carrier substrate 110 are bonded through the eutectic bonding method, compared to the conventional wire bonding method used for bonding the LED and the carrier substrate, it is unnecessary to preserve a space for the height of the bonding wire, such that a usage amount of the molding compound 130d is effectively decreased, and the LED package structure 100d may have a thinner package thickness. Moreover, since the cavity C1 has a shallow tray design, the usage amount of the molding compound 130d is effectively decreased, and it is unnecessary to usage a large amount of the fluorescent material 134d for doping in the molding compound 130d in order to achieve a purpose of changing the color of light emitted by the LED package structure 100d.

Moreover, in other embodiment that is not shown, the structure of the cavity C3 having the included angle α of the aforementioned embodiment can also be adopted, and those skilled in the art may refer to the descriptions of the aforementioned embodiments to select the aforementioned components to achieve a required technical effect according to an actual design requirement.

In summary, since the flip-chip LED of the invention is disposed in the cavity of the carrier substrate, and the vertical distance between the top surface of the molding compound and the bottom surface of the cavity is smaller than or equal to the depth of the cavity, compared to the conventional technique that the LED is electrically connected to the pin electrode through wire bonding, the LED package structure of the invention may have a thinner package thickness, so as to cope with today's thinning demand. Moreover, since the main body of the carrier substrate of the invention is composed of a polymer material, and the difference in CTE between the main body in the rubbery state and the patterned conductive layer is smaller than 30 ppm/° C., a situation that the main body and the patterned conductive layer are peeled off when the temperature drops to result in a fact that the flip-chip LED cannot be effectively fixed on the patterned conductive layer is avoided. In brief, the LED package structure of the invention has better structural reliability.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A light emitting diode package structure, comprising:
   a carrier substrate, comprising a main body and a patterned conductive layer embedded in the main body, the main body being composed of a polymer material, and the main body having a cavity, and a bottom surface of the cavity being aligned with an upper surface of the patterned conductive layer, wherein a difference in coefficient of thermal expansion between the main body in a rubbery state and the patterned conductive layer is smaller than 30 ppm/° C.;
   a flip-chip light emitting diode, disposed inside the cavity of the carrier substrate, and straddling the patterned conductive layer; and
   a molding compound, disposed inside the cavity of the carrier substrate, and encapsulating the flip-chip light emitting diode, wherein a vertical distance between a top surface of the molding compound and the bottom surface of the cavity is equal to a depth of the cavity.

2. The light emitting diode package structure as claimed in claim 1, wherein the flip-chip light emitting diode and the patterned conductive layer are electrically connected through eutectic bonding.

3. The light emitting diode package structure as claimed in claim 1, wherein the polymer material comprises epoxy resin or a siloxane compound.

4. The light emitting diode package structure as claimed in claim 1, wherein a difference in coefficient of thermal expansion between the main body in the rubbery state and the main body in a glassy state is smaller than 35 ppm/° C.

5. The light emitting diode package structure as claimed in claim 1, wherein a sidewall of the cavity surrounds the bottom surface, and the bottom surface and the sidewall include an included angle, wherein the included angle ranges between 95 degrees and 170 degrees.

6. The light emitting diode package structure as claimed in claim 1, wherein a center point of the bottom surface and an edge of the bottom surface of the cavity are spaced by a straight-line distance, and the straight-line distance is greater than or equal to 1 cm and is smaller than or equal to 2 cm.

7. The light emitting diode package structure as claimed in claim 6, wherein the top surface of the molding compound and the upper surface of the patterned conductive layer are spaced by a vertical height, and a ratio between the vertical height and the straight-line distance is between 0.15 and 0.25.

8. The light emitting diode package structure as claimed in claim 1, wherein the top surface of the molding compound and an upper surface of the flip-chip light emitting diode are spaced by a vertical distance, and the vertical distance ranges between 0.05 cm and 0.3 cm.

9. The light emitting diode package structure as claimed in claim 1, wherein the molding compound is doped with a fluorescent material, and the fluorescent material comprises a yellow fluorescent powder, a red fluorescent powder, a green fluorescent powder, a blue fluorescent powder or a yttrium aluminum garnet fluorescent powder, and a particle diameter of the fluorescent powder ranges between 3 μm and 50 μm.

10. The light emitting diode package structure as claimed in claim 9, wherein a weight percentage concentration of the fluorescent material in the molding compound ranges between 20% and 40%.

\* \* \* \* \*